(12) United States Patent
Goldman et al.

(10) Patent No.: US 8,159,377 B2
(45) Date of Patent: Apr. 17, 2012

(54) SYSTEM, METHOD, AND CIRCUITRY FOR BLIND TIMING MISMATCH ESTIMATION OF INTERLEAVED ANALOG-TO-DIGITAL CONVERTERS

(75) Inventors: Naor Goldman, Moshav Ein-Vered (IL); Noam Tal, Givatayim (IL); Yonina Eldar, Haifa (IL); Charles Sestok, Dallas, TX (US); Efrat Levy, Tel Aviv (IL)

(73) Assignee: Texas Instruments Incorporated, Dallas, TX (US)

( * ) Notice: Subject to any disclaimer, the term of this patent is extended or adjusted under 35 U.S.C. 154(b) by 107 days.

(21) Appl. No.: 12/872,043

(22) Filed: Aug. 31, 2010

(65) Prior Publication Data

US 2012/0050079 A1    Mar. 1, 2012

(51) Int. Cl.
*H03M 1/06* (2006.01)
(52) U.S. Cl. ........ 341/118; 375/316; 375/324; 455/108; 455/334; 455/331; 455/115.1; 716/122
(58) Field of Classification Search .......... 341/118–144; 375/316, 324; 455/108, 331, 334, 155.1; 716/122
See application file for complete search history.

(56) References Cited

U.S. PATENT DOCUMENTS

| | | | |
|---|---|---|---|
| 7,250,885 B1 * | 7/2007 | Nairn | 341/141 |
| 7,467,369 B2 * | 12/2008 | Alpert et al. | 716/122 |
| 7,916,050 B1 * | 3/2011 | Mujica et al. | 341/118 |

* cited by examiner

*Primary Examiner* — Lam T Mai
(74) *Attorney, Agent, or Firm* — Steven A. Shaw; W. James Brady; Frederick J. Telecky, Jr.

(57) ABSTRACT

A timing skew estimation system is disclosed that includes a plurality of interleaved analog-to-digital converter circuits (ADCs), a timing mismatch estimation unit, and a correction unit. The timing mismatch estimation unit calculates a correlation between each of the plurality of ADCs. Then the timing mismatch estimation unit calculates a cost function for each of the plurality of ADCs, except the reference ADC. The timing mismatch estimation unit further calculates a gradient for each of the plurality of ADCs, except the reference ADC. The timing mismatch estimation unit also continually calculates the timing skew of each of the plurality of ADCs, except the reference ADC, as the sum of an immediately previous estimate of the timing skew of each ADC, except the reference ADC, and a product of a function of the gradient of each of the plurality of ADCs, except the reference ADC, and a step size, The correction unit continually corrects the output of each of the plurality of ADCs, except the reference ADC, based on the estimates of the timing skew of each of the plurality of ADCs, except the reference ADC. Eventually, the timing skew estimation system determines a converged estimate of the timing skew of each of the plurality of ADCs, except the reference ADC. A method of estimating timing skew and timing skew estimation circuitry are also disclosed.

20 Claims, 5 Drawing Sheets

SYSTEM, METHOD, AND CIRCUITRY FOR BLIND TIMING MISMATCH ESTIMATION OF INTERLEAVED ANALOG-TO-DIGITAL CONVERTERS

TECHNICAL FIELD

The technical field relates generally to the operation of analog-to-digital converters (ADCs), and more specifically to estimating timing mismatch among a plurality of interleaved ADCs.

BACKGROUND

Modern systems today require fast and accurate ADCs. That is to say, modern systems utilize ADCs that sample large numbers of bits at high frequencies. Examples of such modern systems include high speed communication systems and digital signal processor (DSP) applications.

One development in the art increases the sampling rate of an ADC by interleaving multiple slower ADCs, and adding a different phase offset to the clock at the input of each of the multiple slower ADCs. By interleaving the samples, an overall sampling rate is achieved that is equal to the product of the total number of interleaved ADCs and the individual sampling rate of each of the ADCs.

The above describe arrangement is referred to simply as an interleaved ADC. Although the sampling rate of an interleaved ADC is higher than a conventional single ADC architecture, there is a problem with the interleaved ADC. Specifically, in an interleaved ADC mismatches are introduced between different ADC branches including a timing offset that is sometimes referred to as timing skew. It should be noted that the terms "mismatch", "timing mismatch", "skew", "timing skew", "offset", and "timing offset" may be used interchangeably in this disclosure.

In order to achieve high performance and high speed with an interleaved ADC, it is necessary to resolve the problem of timing skew. One way of resolving the problem is by estimating the timing skew, and then correcting the skew in either of the analog or digital domains. Embodiments disclosed herein therefore relate to estimating the timing skew by relying on cross-correlations between adjacent ADC branches.

There are several advantages to the embodiments disclosed herein. Initially, the complexity of an interleaved ADC as disclosed herein remains very low. Additionally, the estimation of the skew (and subsequent correction thereof) in each of the interleaved ADCs can be performed with very few limiting conditions as to the properties of input analog signals being sampled. Finally, an identification of the type of input signal is not required such that the estimation of the timing skew is referred to as being "blind."

SUMMARY

Accordingly, one embodiment disclosed herein provides a method of estimating timing skew. The method includes performing, on the output of a plurality of interleaved converter circuits (ADCs), including a reference ADC, a gradient loop from a block of samples of a particular size. The gradient loop includes: empirically determining a cross-correlation of the digital output between adjacent ADCs, including determining a cross-correlation between a last among the plurality of ADCs and a first of the plurality of ADCs; determining a cost function for each of the plurality of ADCs, except the reference ADC, as a square of a difference between adjacent cross-correlations; and determining a gradient for each of the plurality of ADCs, except the reference ADC, that is proportional to the derivative of the corresponding cost function of each of the plurality of ADCs, except the reference ADC.

The method further includes determining an initial estimate of a timing skew of each of the plurality of ADCs, except the reference ADC, as the product of a function of the gradient of each of the plurality of ADCs, except the reference ADC, and a step size. The method further includes correcting the output of each of the plurality of ADCs, except the reference ADC, based on the initial estimate of the timing skew of each of the plurality of ADCs, except the reference ADC. The method further includes determining a converged estimate of the timing skew of each of the plurality of ADCs, except the reference ADC.

Determining a converge estimate includes continually performing on the output of the plurality of interleaved ADCs, including the reference ADC, the gradient loop on additional blocks of samples of the particular size. Determining a converged estimate further includes continually determining a subsequent estimate of the timing skew of each ADC, except the reference ADC, as the sum of an immediately previous estimate of the timing skew of each ADC, except the reference ADC, and a product of a function of the gradient of each of the plurality of ADCs, except the reference ADC, and the step size. Determining a converged estimate lastly includes continually correcting the output of each of the plurality of ADCs, except the reference ADC, based on the continually determined subsequent estimate of the timing skew of each of the plurality of ADCs, except the reference ADC.

Another embodiment disclosed herein provides a system for estimating timing skew. The system includes a plurality of interleaved analog-to-digital converter circuits (ADCs), including a reference ADC; a timing mismatch estimation unit; and a correction unit. The functionality of the system for estimating timing skew is now described.

The timing mismatch estimation unit performs, on the output of the plurality of interleaved analog-to-digital converter circuits ADCs, a gradient loop from a block of samples of a particular size. The gradient loop includes: empirically determining a cross-correlation of the digital output between adjacent ADCs, including determining a cross-correlation between a last among the plurality of ADCs and a first of the plurality of ADCs; determining a cost function for each of the plurality of ADCs, except the reference ADC, as a square of a difference between adjacent cross-correlations; and determining a gradient for each of the plurality of ADCs, except the reference ADC, that is proportional to the derivative of the corresponding cost function of each of the plurality of ADCs, except the reference ADC. The timing mismatch estimation unit further determines an initial estimate of a timing skew of each of the plurality of ADCs, except the reference ADC, as the product of a function of the gradient of each of the plurality of ADCs, except the reference ADC, and a step size.

The correction unit corrects the output of each of the plurality of ADCs, except the reference ADC, based on the initial estimate of the timing skew of each of the plurality of ADCs, except the reference ADC. The timing mismatch estimation unit then determines a converged estimate of the timing skew of each of the plurality of ADCs, except the reference ADC. The timing mismatch unit determines the converged estimate by continually performing on the output of the plurality of interleaved ADCs, including the reference ADC, the gradient loop on additional blocks of samples of the particular size; continually determining a subsequent estimate of the timing skew of each ADC, except the reference ADC, as the sum of an immediately previous estimate of the timing skew of each ADC, except the reference ADC, and a product of a function of the gradient of each of the plurality of ADCs, except the reference ADC, and the step size, the correcting unit continually correcting the output of each of the plurality of ADCs, except the reference ADC, based on the continually determined subsequent estimate of the timing skew of each of the plurality of ADCs, except the reference ADC.

A third embodiment described herein is timing skew estimation circuitry. The timing skew estimation circuitry has components configured to preserve operations implementing a method for estimating timing skew. The implemented method for estimating timing skew includes the same limitations as the method described above as a first embodiment.

It should be noted that the purpose of the foregoing abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

BRIEF DESCRIPTION OF THE DRAWINGS

The accompanying figures, where like reference numerals refer to identical or functionally similar elements and which together with the detailed description below are incorporated in and form part of the specification, serve to further illustrate various exemplary embodiments and to explain various principles and advantages in accordance with the embodiments.

FIG. 3, including

DETAILED DESCRIPTION

In overview, the present disclosure concerns timing skew estimation on the output of a plurality of interleaved ADCs. The instant disclosure is provided to further explain in an enabling fashion the best modes of performing one or more embodiments. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms such as first and second, and the like, if any, are used solely to distinguish one from another entity, item, or action without necessarily requiring or implying any actual such relationship or order between such entities, items or actions. It is noted that some embodiments may include a plurality of processes or steps, which can be performed in any order, unless expressly and necessarily limited to a particular order; i.e., processes or steps that are not so limited may be performed in any order.

Much of the inventive functionality and many of the inventive principles when implemented, are best supported with or in software or integrated circuits (ICs), such as a digital signal processor and software therefore, and/or application specific ICs. It is expected that one of ordinary skill, notwithstanding possibly significant effort and many design choices motivated by, for example, available time, current technology, and economic considerations, when guided by the concepts and principles disclosed herein will be readily capable of generating such software instructions or ICs with minimal experimentation. Therefore, in the interest of brevity and minimization of any risk of obscuring principles and concepts, further discussion of such software and ICs, if any, will be limited to the essentials with respect to the principles and concepts used by the exemplary embodiments.

Figure 1:
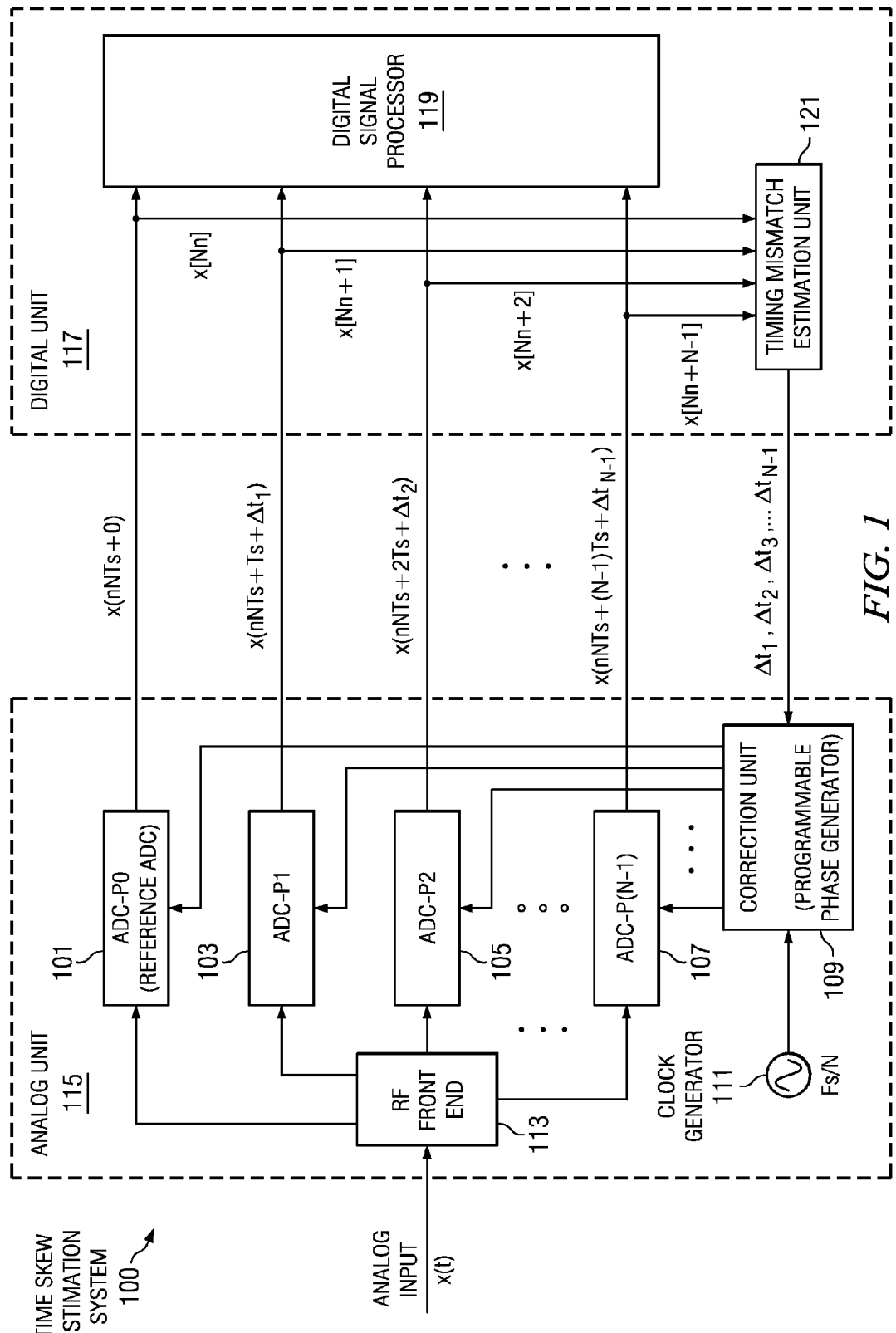
FIG. 1 is a block diagram illustrating the components of a timing skew estimation system.

As further discussed herein below, various inventive principles and combinations thereof are advantageously employed to estimate and correct timing skew introduced between different ADC branches in multiple interleaved ADCs. Referring now to FIG. 1, a diagram illustrating an exemplary timing skew estimation system 100 will be discussed and described. The timing skew estimation system 100 includes two primary components: an analog unit 115 and a digital unit 117.

The analog unit 115 includes an RF front end 113, a plurality of interleaved ADCs 101, 103, 105, and 107, a clock generator 111, and a correction unit 109. The digital unit 117 includes a DSP 119 and a timing mismatch estimation unit 121. The following expressions will be used in describing the operation the timing skew estimation system 100. "x(t)" is the input analog signal that is received at the RF front end 113. "Fs" represents the sampling frequency of the interleaved ADCs as a whole. "Ts" represents the sampling interval of the interleaved ADCs as a whole, which is thus equivalent to 1/Fs. "N" represents the total number of ADCs which are interleaved in the system, each one of the interleaved ADCs capable of sampling at Fs/N rate. "$\Delta t_i$" is the timing skew of each of the plurality of ADC for i>0 relative to ADC-P0 101. Finally, "x[Nn+i]" is the sampled digital signal for ADC phase i (i=0, 1, . . . , N−1). It should be noted that in FIG. 1 in the expressions representing the output of the plurality of interleaved ADCs 101, 103, 105, and 107, the "t" index and the "n" index are replaced with the appropriate actual time values.

As mentioned above x(t) represents an analog/continuous signal where t is a continuous time index. Further, x[n] represents a digital/sampled analog signal where n is a discrete (integer) time index. So in an ideal single ADC, x[n]=x(n*Ts) where the ADC samples the continuous signal at discrete times.

In FIG. 1, however, a plurality of interleaved ADCs 101, 103, 105, and 107 are implemented. Ideal interleaved ADCs would sample as follows:

ADC-$P0$ 101 would sample $x[N*n]=x(n*N*Ts)$;

ADC-$P1$ 103 would sample $x[N*n+1]=x(n*N*Ts+Ts)$;

ADC-$P2$ 105 would sample $x[N*n+2]=x(n*N*Ts+2*Ts)$; and

ADC-$P(N-1)$ 107 would sample $x[N*n+N-1]=x(n*N*Ts+(N-1)Ts)$.

In FIG. 1, each of the plurality of interleaved ADCs 101, 103, 105, and 107 would ideally receive a different phase of the Fs/N clock 111. The phase offset between each clock would ideally be Ts so that sampling will be uniform. However imperfections in the analog domain cause the clocks actual offset from each other to be slightly different. This causes a timing mismatch such that the signal x(t) is actually not sampled uniformly.

Thus the actual sampling of the interleaved ADCs 101, 103, 105, and 107 is slightly different from above. The actual sampling of the timing skew estimation is thus as follows:

ADC-P0 101 samples $x_0[N^*n]=x(n^*N^*Ts+0)$;

ADC-P1 103 samples $x_1[N^*n+1]=x(n^*N^*Ts+Ts+\Delta t_1)$;

ADC-P2 105 samples $x_2[N^*n+2]=x(n^*N^*Ts+2^*Ts+\Delta t_2)$; and

ADC-P(N−1) 107 samples $x[N^*n+N-1]=x(n^*N^*Ts+(N-1)Ts+\Delta t_{N-1})$.

It should be noted that ADC-P0 101 in this example serves as a reference sampler, so there is no offset (indicated as "+0" in the equations).

In other words, each of the plurality of the interleaved ADCs 103, 105, and 107 has a slight skew in the timing of its sampling. The reference ADC, that is ADC-P0 101, has no skew by definition. It should be noted that any of the interleaved ADCs 101, 103, 105, and 107 could serve as the reference ADC. For ease of explanation, as well as for convenience, ADC-P0 101 is selected as the reference sampler in FIG. 1.

Correction of the skew can be performed in either the analog or digital domain. In FIG. 1, the correction unit 109 (embodied as a programmable phase generator) receives estimations of each skew $\Delta t_1, \Delta t_2, \Delta t_3, \ldots, \Delta t_{N-1}$ from the timing mismatch estimation unit 121. The phase generator 109, in coordination with signals from the clock generator 101, adjusts the offset of the phase slightly to reflect the timing skew. As described below, the estimation and correction of each timing skew $\Delta t_1, \Delta t_2, \Delta t_3, \ldots, \Delta t_{N-1}$ is ongoing until the skew becomes so small that the effects are negligible.

In FIG. 1, the timing skew estimation system 100 operates in a closed loop, the timing mismatch estimation unit 121 continually estimating mismatch for use by the correction unit 109. However, the focus of the embodiments disclosed herein relate primarily to the operation of the timing mismatch estimation unit 121. In summary, mismatch estimation is performed in the timing mismatch estimation unit 121 by calculating a gradient function for each of ADC phases 1, 2, … N−1, and updating the estimated mismatch by a descending gradient algorithm. The mismatch estimation unit 121 is now described in greater detail.

Initially, the timing mismatch estimation unit 121 performs, on the output of the plurality of the interleaved ADCs 101, 103, 105, and 107, a gradient loop from a block of samples of a particular size M. The gradient loop includes empirically determining a cross-correlation of the digital output between adjacent ADCs, including determining a cross-correlation between the last among the plurality of ADCs (that is, ADC-P(N−1) 107)) and a first of the plurality of ADCs (that is, ADC-P0 101).

The required empirical determination of cross-correlations between adjacent ADCs can be represented mathematically. Noting that $x_i[n]=x[Nn+i]$, single instances of cross-correlations are given by:

$$R_{i,i+1}[0]=R_{x_i x_{i+1}}[0]=\overline{x_i[n] \cdot x_{i+1}[n]} \; (i=0, 1, \ldots, N-1) \tag{1}$$

In equation (1), $R_{i,i+1}[0]$ represents the cross-correlations between adjacent ADCs at a distance zero. The expression $\overline{x_i[n] \cdot x_{i+1}[n]}$ simply represents that the cross-correlations between adjacent ADCs are actually the cross-correlation of expected (hence the use of the bar) adjacent samples in the interleaved sample stream.

As mentioned above, the cross-correlations between adjacent ADCs are calculated empirically over a certain block of size M samples. The empirical statistics are represented mathematically as:

$$\hat{R}_{i,i+1}[0] = \frac{1}{M}\sum_{n=0}^{M} x_i[n] \cdot x_{i+1}[n] \tag{2}$$

$(i=0, 1, \ldots, N-1)$

Equation 2 simply represents the summation of the cross-correlations taken over M samples.

The gradient loop further includes the timing mismatch estimation unit 121 determining a cost function for each of the plurality of ADCs 103, 105, 107. The cost function is given as a square of a difference between adjacent cross-correlations. The cost function can also be represented mathematically as:

$$C_i=(\hat{R}_{i-1,i}[0]-\hat{R}_{i,i+1}[0])^2 \; (i=1,\ldots,N-1) \tag{3}$$

It should be noted that the cost function for adjacent ADCs should be 0 if the samples are uniformly sampled; that is if the timing mismatch between adjacent ADCs is 0.

The gradient loop lastly includes calculating the gradient for each of the plurality of ADCs 103, 105, 107. The gradient is proportional to the derivative of the cost function according to the respective timing skew $\Delta_i$. That is to say, $$\frac{\partial C_i}{\partial \Delta_i} \tag{4}$$

$(i=1,\ldots,N-1)$

Thus a descending gradient algorithm can be used to converge on the skew values. The gradient, as proportional to the derivative of the cost function, is expressed mathematically as:

$$g_i=\hat{R}_{i-1,i}[0]-\hat{R}_{i,i+1}[0] \; (i=1,\ldots,N-1) \tag{5}$$

Once a gradient is calculated for each of the each of the plurality of ADCs 103, 105, 107 over a certain block of size M samples, the timing mismatch estimation unit 121 determines an initial estimate of a timing skew of each of the plurality of ADCs 103, 105, 107 as the product of a function of the gradient of each of the plurality of ADCs 103, 105, 107 and a step size. The function of gradient may be the gradient itself, which produces a numerical value, or may be a sign function of the gradient which produces a positive or negative response. Other functions of the gradient may also be used. The initial estimate of the timing skew thus may be given as:

$$\text{Initial } \Delta_i = \text{step} \cdot g_i \; (i=1,\ldots,N-1) \tag{6}$$

$$\text{or Initial } \Delta_i = \text{step} \cdot \text{sign}(g_i) \; (i=1,\ldots,N-1) \tag{7}$$

In equations (6) and (7), "step" represents the step size and "sign" represents the sign function.

Once an initial estimate of the timing skew of each of the plurality of ADCs 103, 105, 107 has been made, the skew values $\Delta t_1, \Delta t_2, \Delta t_3, \ldots, \Delta t_{N-1}$ are provided from the timing mismatch estimation unit 121 to the correction unit 109. The correction unit 109 adjusts the offset of the phase to reflect the timing skew. However, multiple iterations of the gradient loop and skew estimation are required before the skew of each of the plurality of ADCs 103, 105, 107, converges to an accurate value.

Therefore, the timing skew estimation unit 121 determines a converged estimate of the timing skew of each of the plurality of ADCs 103, 105, 107 as now described. The timing skew estimation unit 121 continually performs on the output of the plurality of interleaved ADCs 101, 103, 105, 107, the gradient loop on additional blocks of samples of size M. The timing skew estimation unit 121 continually determines a subsequent estimate of the timing skew of each ADC 103, 105, 107 as the sum of an immediately previous estimate of the timing skew of each ADC 103, 105, 107 and a product of a function of the gradient of each of the plurality of ADCs 103, 105, 107 and the step size.

The continual estimation of the subsequent estimate of the timing skew of each ADC 103, 105, 107 is represented different mathematically from the initial estimate of the timing skew. As mentioned above, the subsequent estimates of skew are based on previous estimates of skew such that equations (6) and (7) are modified, and given as:

$$\text{Subsequent } \Delta_i^{(k+1)} = \Delta_i^{(k)} + \text{step} \cdot g_i^{(k)} \quad (i=1, \ldots, N-1) \quad (8)$$

$$\text{or Subsequent } \Delta_i^{(k+1)} \times \Delta_i^{(k)} + \text{step} \cdot \text{sign}(g_i^{(k)}) \quad (i=1, \ldots N-1) \quad (9)$$

In equations (8) and (9), again "step" represents the step size and "sign" represents the sign function. Additionally, "k" represents an iteration number in the continual process As subsequent estimates of the timing skew of the plurality of ADCs 103, 105, 107 are made, the correction unit 109 is continually provided with the skew values $\Delta t_1, \Delta t_2, \Delta t_3, \ldots, \Delta t_{N-1}$ from the timing mismatch estimation unit 121. The correction unit 109 continually adjusts the offset of the phase to reflect these subsequent timing skews. Assuming that the sign of the gradient of each of the plurality of ADCs 103, 105, 107 points in the correct direction, eventually $\Delta t_1, \Delta t_2, \Delta t_3, \ldots, \Delta t_{N-1}$ will converge to the true skew values.

Several points related to the timing skew estimation system 100 should be noted. Initially, step size can be either a single parameter or a set of parameters. Further, step size is a variable parameter that is adjusted to increase accuracy. Specifically, convergence time can be decreased by setting a step size as a large value that is decreased gradually until reaching desired estimation accuracy.

With respect to convergence results, experimentation has shown that convergence to a single solution (single minimum) occurs in an interleaved ADC with just 2 ADCs. When there are in excess of 2 ADCs, experimentation shows convergence to a correct solution of each skew estimate without local minima for signals meeting the regularity conditions.

As indicated above, the timing skew estimation system 100 can be considered a "blind" system. This term of art, known to practitioners of ordinary skill, indicates that information need not be known about the analog signal x(t) entering the RF front end 113. However, to enable the blind property, the cross-correlations of the signal must be equal between adjacent samples when there is no timing mismatch in the sampling. That is to say, the cross-correlations between adjacent samples are equal:

$$R_{i-1,i}[0] = R_{i,i+1}[0] \quad (i=1, \ldots, N-1) \quad (10)$$

Equation (10) implies that the incoming signal x(t) should be cyclo-stationary, that is a signal having statistical properties that vary cyclically with time. The vast majority of modern communication systems use signals that in fact posses this property. Additionally, in most cases, multiple tone signals posses this property as well.

If it known that the signal x(t) is within the first Nyquist zone, that is when the input signal is located [−Fs/2, Fs/2], the timing skew estimation system 100 will produce estimates of timing skew that have properly converged. However, if the input signal x(t) is outside of the first Nyquist zone, it may be necessary to invert the sign of the gradient in order for estimates of timing skew to converge. For example, if x(t) is in the second Nyquist zone, that is [Fs/2, 3Fs/2], it is necessary to invert the sign of the gradient. If x(t) is located in the Nyquist zone defined by [3Fs/2, 5Fs/2], then inversion is not required. The need for inversion of the sign of the gradient continues to alternate as the Nyquist zones increase by Fs/2.

If it is known in advance which Nyquist zone is occupied by x(t), the timing skew estimation system 100 can be implemented, as is known in the art, to provide the correct sign of the gradient through the gradient function. For example, when signals input into the plurality of interleaved ADCs 101, 103, 105, 107 will be known to be in a Nyquist band range between the product of a sampling frequency (Fs) of the interleaved ADC and ½ (that is to say, Fs/2) and the product of the sampling frequency (Fs) of the interleaved ADC and 3/2 (that is to say, 3Fs/2), the timing mismatch estimation unit's 121 determining the subsequent estimate of the timing skew of each ADC, except the reference ADC, is adjusted to determine the subsequent estimate of the timing skew of each ADC, except the reference ADC, as the sum of an immediately previous estimate of the timing skew of each ADC, except the reference ADC, and a product of a function of the gradient, the step size, and −1. That is to say, the sign of the function of the gradient is inverted.

However, determining whether the sign of the gradient should be inverted can also be determined automatically. A detailed explanation of how to determine whether to invert the sign of gradient is now provided. Initially, the timing mismatch estimation unit 121 must continually set a second cost function as the sum of the absolute value of the gradient function for each of the plurality of ADCs 103, 105, 107. This can be expressed mathematically as:

$$2ndC = \sum_{n=1}^{N-1} |g_i| \quad (11)$$

$$(i = 1, \ldots, N-1)$$

The timing mismatch estimation unit 121 must then continually set an averaged second cost function as an average of a plurality of second cost functions determined over several blocks of size M. There are several mechanisms, which would be known to the ordinary practitioner in the art, for averaging the second cost function over the several blocks of size M. One mechanism for averaging the second cost function is through a smoothing function, which is expressed mathematically as:

$$\overline{2ndC}^{(n)} = (1-a) \cdot \overline{2ndC}^{(n-1)} + a \cdot 2ndC \quad (12)$$

In equation 12, $\overline{2ndC}^{(n)}$ are $\overline{2ndC}^{(n-1)}$ averaged second cost functions and a is simply an averaging factor.

The timing mismatch estimation unit 121 then continually compares the averaged second cost function with a product of the second cost function and a threshold value. When the averaged second cost function is less then the product of the second cost function and the threshold value, the timing mismatch estimation unit 121 determines the subsequent estimate of the timing skew of each ADC 103, 105, 107 as the sum of an immediately previous estimate of the timing skew of each ADC 103, 105, 107 and a product of a function of the gradient, a predetermined step size, and −1.

This continual comparison of the averaged second cost function can also be expressed mathematically as:

$$\overline{2ndC}^{(n)} < 2ndC \cdot \text{signThresh} \quad (13)$$

In inequality 13, signThresh is the threshold value. Where inequality (13) is determined to be affirmative, then $$\text{Subsequent } \Delta_i^{(k+1)} = \Delta_i^{(k)} + (-1 \cdot \text{step} \cdot g_i^{(k)}) \ (i=1, \ldots, N-1) \quad (14)$$

$$\text{or Subsequent } \Delta_i^{(k+1)} = \Delta_i^{(k)} + (-1 \cdot \text{step} \cdot \text{sign}(g_i^{(k)})) \ (i=1, \ldots, N-1) \quad (15)$$

To summarize, the automatic determining of whether the sign of the function of gradient should be inverted (based on which Nyquist zone the signal x(t) falls within), when the averaged second cost function is less then the product of the second cost function and the threshold value, the sign of the function of the gradient is inverted. This can be performed by multiplying the product of the step size and the function of the gradient by −1.

Figure 2:
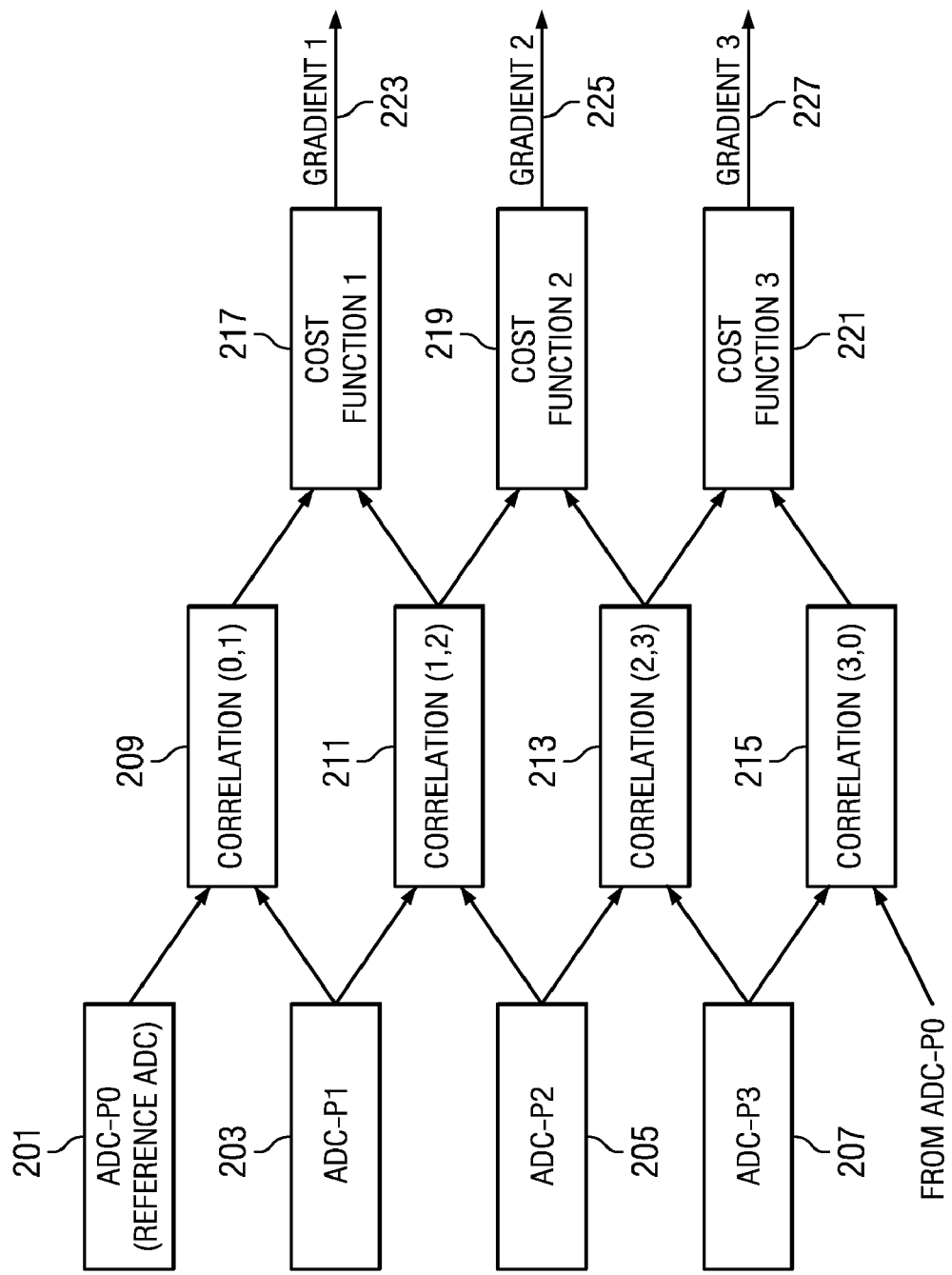
FIG. 2 is a block diagram illustrating a logical representation of timing skew estimation.

Referring now to FIG. 2, a block diagram illustrating a logical representation of timing skew estimation is discussed and described. FIG. 2 is presented to simply show the relationship between the cross-correlations, cost functions, and gradients of a plurality of interleaved ADCs 201, 203, 205, 207 in an interleaved ADC. It should be noted that the arrows in FIG. 2 do not represent input/output but, rather simply indicate that blocks are logically related. The logical relationships in FIG. 2 will now be discussed in more detail.

As can be seen, correlation (0,1) 209 is the cross-correlation between the ADC-P0 201 (the reference ADC) and ADC-P1 203. Correlation (1,2) 211 is the cross-correlation between ADC-P1 203 and ADC-P2 205. Correlation (2,3) 213 is the cross-correlation between ADC-P2 205 and ADC-P3 207. Finally, correlation (3,0) 215 is the cross-correlation between ADC-P3 207 and ADC-P0 201 (the reference ADC). The correlations 209, 211, 213, 215 demonstrate that there are N cross-correlations (that is the total number of interleaved ADCs) and that a cross-correlation exists between a last among the plurality of ADCs (ADC-P3 207) and a first of the plurality of ADCs (ADC-P0 201).

FIG. 2 also illustrates that cost functions 217, 219, 221 are in part determined as a difference between adjacent cross-correlations. As noted above, the cost function may be given as a square of a difference between adjacent cross-correlations. Thus cost function 1 217 is determined in part by the difference of correlation (0,1) 209 and correlation (1,2) 211. The cost function 2 219 is determined in part by the difference of correlation (1,2) 211 and correlation (2,3) 213. The cost function 3 221 is determined in part by the difference of correlation (2,3) 213 and correlation (3,0) 215. As can be seen in FIG. 2, while N cross-correlations are determined, only N−1 cost functions are calculated. It can be easily seen that a cost function is not calculated for the reference ADC, ADC-P0 201. This is quite sensible as the reference sampler is always considered as having no timing skew, irrespective of its position. As with FIG. 1, ADC-P0 101 is selected as the reference sampler in FIG. 2 for ease of explanation, as well as for convenience. However, any of the interleaved ADCs 201, 203, 205, 207 could have been set as the reference ADC.

As mentioned above, the gradient of each of the ADCs except the reference ADC is proportional to the derivative of the cost function. Therefore, the gradient 1 223 is proportional to the derivative of cost function 1 217. The gradient 2 225 is proportional to the derivative of cost function 2 219. Finally, the gradient 3 227 is proportional to the derivative of cost function 3 221.

Figure 3A:
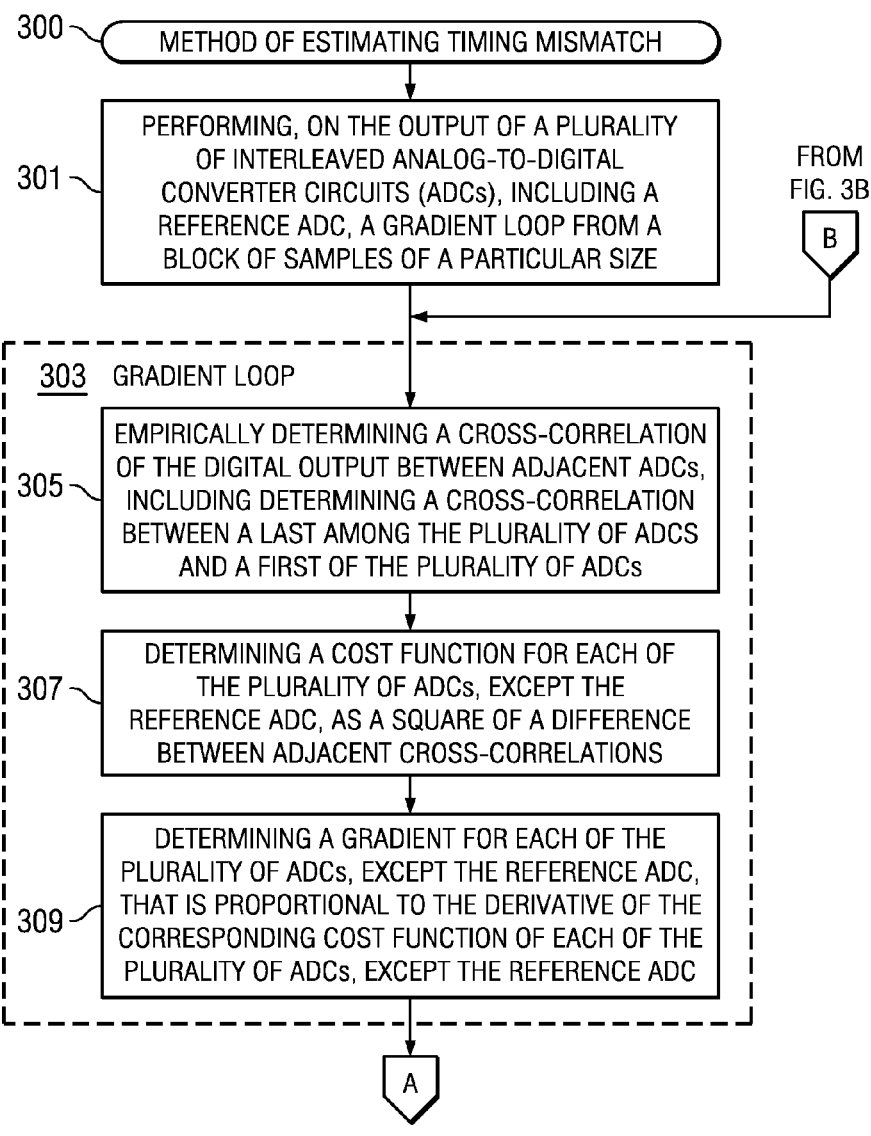
FIGS. 3A and 3B, is a flow chart illustrating a method of estimating timing mismatch.
Figure 3B:
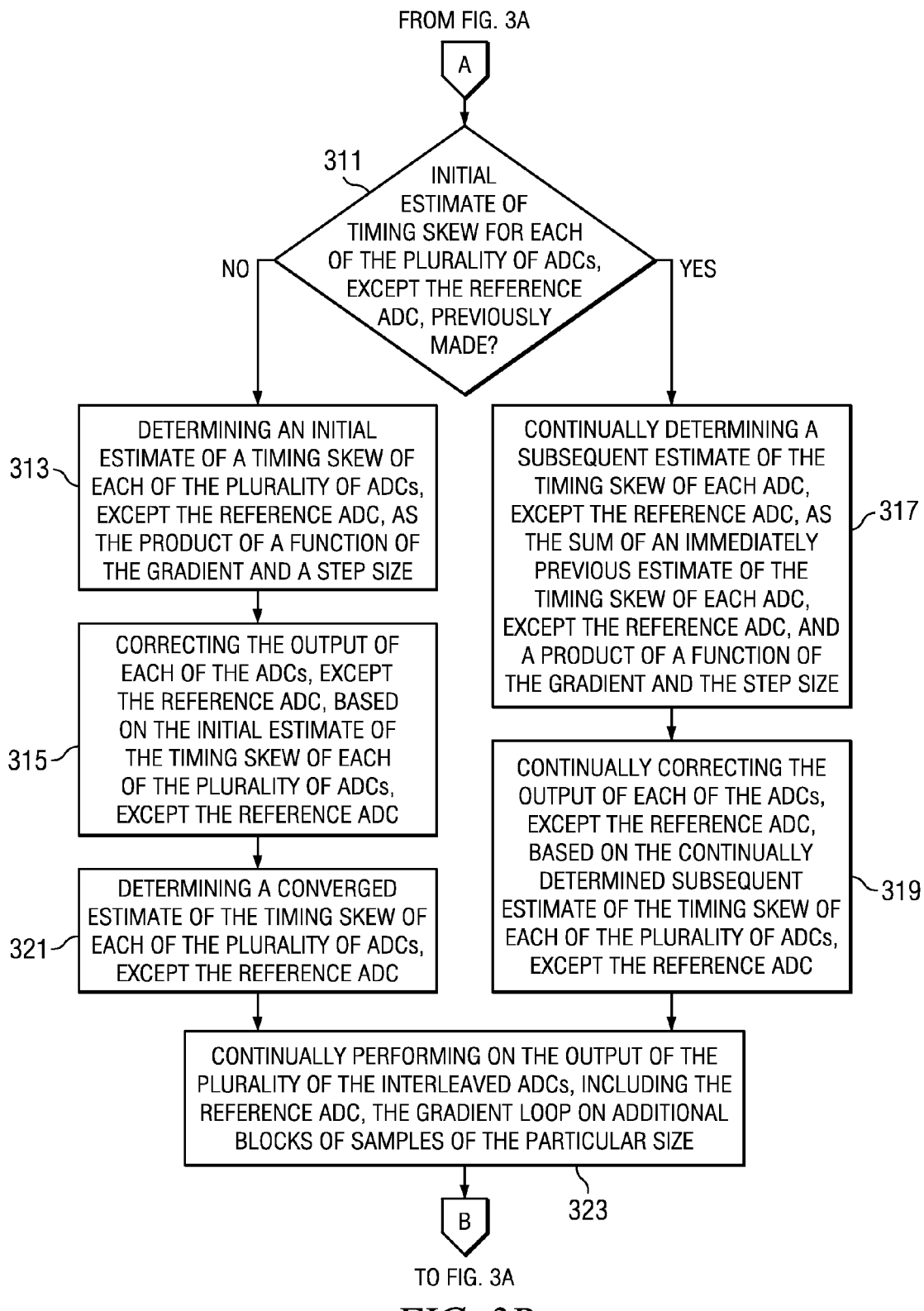

Referring now to FIG. 3, a flow chart illustrating a method of estimating timing skew is discussed and described. FIG. 3 includes FIGS. 3A and 3B. However, it should be noted that FIGS. 3A and 3B are not broken apart for any other reason than ease of illustration.

A method of estimating timing mismatch 300 comprising performing 301, on the output of a plurality of interleaved analog-to-digital converter circuits (ADCs), including a reference ADC, a gradient loop 303 from a block of samples of a particular size. The gradient loop 303 includes empirically determining 301 a cross-correlation of the digital output between adjacent ADCs, including determining a cross-correlation between a last among the plurality of ADCs and a first of the plurality of ADCs. The gradient loop 303 further includes determining 307 a cost function for each of the plurality of ADCs, except the reference ADC, as a square of a difference between adjacent cross-correlations. The gradient loop 303 lastly includes determining 309 a gradient for each of the plurality of ADCs, except the reference ADC, that is proportional to the derivative of the corresponding cost function of each of the plurality of ADCs, except the reference ADC.

A query 311 is next decided as to whether an initial estimate of timing skew for each of the plurality of ADCs, except the reference ADC has been previously made. If an initial estimate has not been previously made, the method of estimating timing mismatch 300 includes determining 313 an initial estimate of a timing skew of each of the plurality of ADCs, except the reference ADC, as the product of a function of the gradient of each of the plurality of ADCs, except the reference ADC, and a step size. The method of estimating timing mismatch 300 further includes correcting 315 the output of each of the plurality of ADCs, except the reference ADC, based on the initial estimate of the timing skew of each of the plurality of ADCs, except the reference ADC.

The method of estimating timing mismatch 300 further includes determining 321 a converged estimate of the timing skew of each of the plurality of ADCs, except the reference ADC. The method of estimating timing mismatch 300 and determining 321 a converged estimate includes continually performing 323 on the output of the plurality of interleaved ADCs, including the reference ADC, the gradient loop 303 on additional blocks of samples of the particular size. As each gradient loop 303 is completed, the query 311 is again decided as to whether an initial estimate of timing skew for each of the plurality of ADCs, except the reference ADC has been previously made. After determining 313 the initial estimate of time skew, the query 311 is always answer affirmative The method of estimating timing mismatch 300 thus further includes continually determining 317 a subsequent estimate of the timing skew of each ADC, except the reference ADC, as the sum of an immediately previous estimate of the timing skew of each ADC, except the reference ADC, and a product of a function of the gradient of each of the plurality of ADCs, except the reference ADC, and the step size. The method of estimating timing mismatch 300 further includes continually correcting 319 the output of each of the plurality of ADCs, except the reference ADC, based on the continually determined subsequent estimate of the timing skew of each of the plurality of ADCs, except the reference ADC. The method of estimating timing mismatch 300 loops to include continually performing 323 the gradient loop 311, continually determining 317 a subsequent estimate of timing skew of each of the plurality of ADCs, except the reference ADC, and continually correcting 319 the output of each of the ADCs, except the reference ADC.

Figure 4:
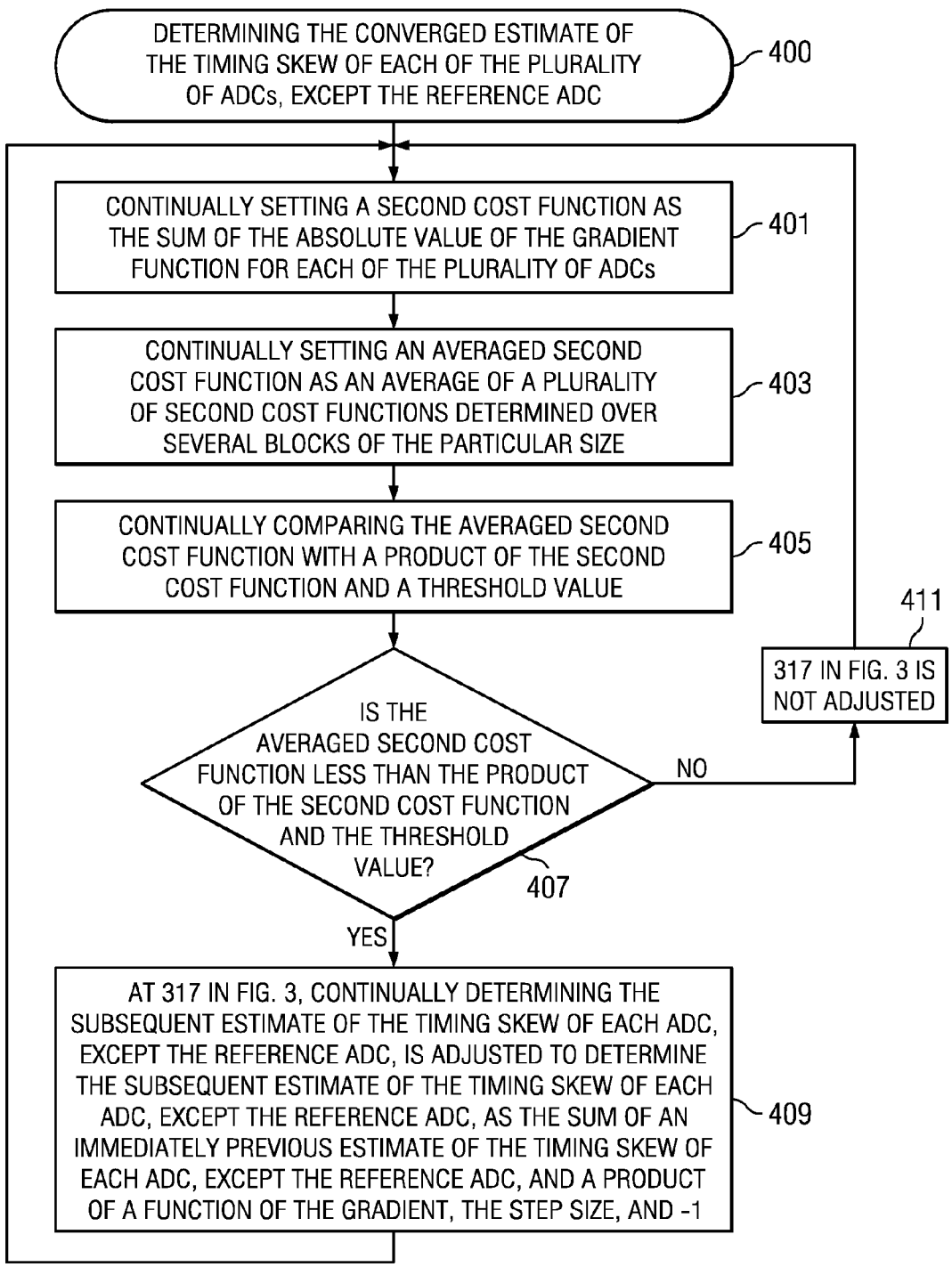
FIG. 4 is a flow chart illustrating additional features of the method of estimating timing mismatch illustrated in FIG. 3.

Referring now to FIG. 4, a flow chart illustrating additional features of the method of estimating timing mismatch illustrated in FIG. 3 is discussed and described. Specifically, determining 400 the converged estimated of timing skew of each of the plurality of ADCs, except the reference ADC includes additional features that modify FIG. 3. Determining 400 the converged estimated of timing skew of each of the plurality of ADCs, except the reference ADC includes continually setting 401 a second cost function as the sum of the absolute value of the gradient function for each of the plurality of ADCs.

Determining 400 the converged estimated of timing skew of each of the plurality of ADCs, except the reference ADC further includes setting an averaged second cost function as an average of a plurality of second cost functions determined over several blocks of the particular size. Determining 400 the converged estimated of timing skew of each of the plurality of ADCs, except the reference ADC further includes continually comparing the averaged second cost function with a product of the second cost function and a threshold value.

A query 407 is next decided as to whether the averaged second cost function is less then the product of the second cost function and the threshold value. Determining 400 the converged estimated of timing skew of each of the plurality of ADCs, except the reference ADC further includes, when the query 407 returns yes, includes continually determining the subsequent estimate of the timing skew of each ADC, except the reference ADC as the sum of an immediately previous estimate of the timing skew of each ADC, except the reference ADC, and a product of a function of the gradient, the step size, and −1. That is to say, continually 317 determining a converged estimated of timing skew of each of the plurality of ADCs, except the reference ADC in FIG. 3 is adjusted to continually determine the subsequent estimate of the timing skew of each ADC, except the reference ADC as the sum of an immediately previous estimate of the timing skew of each ADC, except the reference ADC, and a product of a function of the gradient, the step size, and −1. Contrary wise, when the query 407 returns no, determining 400 the converged estimate of timing skew of each of the plurality of ADCs, except the reference ADC does not include adjusting continually determining 317 a converged estimated of timing skew of each of the plurality of ADCs, except the reference ADC in FIG. 3.

The procedure and or systems described in this disclosure can advantageously be implemented on, for example, a processor of a controller that may comprise one or more microprocessors and/or one or more digital signal processors. These processor may be coupled to memory locations that may include multiple memory locations for storing, among other things, programs for causing the processor to operate in connection with the various functionality described herein. Alternatively, the methods and systems described herein may be implemented on low level circuitry with instructions hardwired therein.

This disclosure is intended to explain how to fashion and use various embodiments in accordance with the invention rather than to limit the true, intended, and fair scope and spirit thereof. The invention is defined solely by the appended claims, as they may be amended during the pendency of this application for patent, and all equivalents thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A method of estimating timing skew, comprising:
performing, on the output of a plurality of interleaved analog-to-digital converter circuits (ADCs), including a reference ADC, a gradient loop from a block of samples of a particular size, the gradient loop including:
empirically determining a cross-correlation of the digital output between adjacent ADCs, including determining a cross-correlation between a last among the plurality of ADCs and a first of the plurality of ADCs,
determining a cost function for each of the plurality of ADCs, except the reference ADC, as a square of a difference between adjacent cross-correlations, and
determining a gradient for each of the plurality of ADCs, except the reference ADC, that is proportional to the derivative of the corresponding cost function of each of the plurality of ADCs, except the reference ADC;
determining an initial estimate of a timing skew of each of the plurality of ADCs, except the reference ADC, as the product of a function of the gradient of each of the plurality of ADCs, except the reference ADC, and a step size;
correcting the output of each of the plurality of ADCs, except the reference ADC, based on the initial estimate of the timing skew of each of the plurality of ADCs, except the reference ADC; and
determining a converged estimate of the timing skew of each of the plurality of ADCs, except the reference ADC, by:
continually performing on the output of the plurality of interleaved ADCs, including the reference ADC, the gradient loop on additional blocks of samples of the particular size,
continually determining a subsequent estimate of the timing skew of each ADC, except the reference ADC, as the sum of an immediately previous estimate of the timing skew of each ADC, except the reference ADC, and a product of a function of the gradient of each of the plurality of ADCs, except the reference ADC, and the step size, and
continually correcting the output of each of the plurality of ADCs, except the reference ADC, based on the continually determined subsequent estimate of the timing skew of each of the plurality of ADCs, except the reference ADC.

2. The method according to claim 1, wherein
the step size decreases as the estimate of the timing skew decreases.

3. The method according to claim 1, wherein
the step size can be either a single parameter or a set of parameters.

4. The method according to claim 1, wherein
the function of the gradient is one of the gradient itself and a sign function of the gradient.

5. The method according to claim 1, wherein
determining the converged estimate of the timing skew of each of the plurality of ADCs, except the reference ADC, additionally includes:

continually setting a second cost function as the sum of the absolute value of the gradient function for each of the plurality of ADCs;

continually setting an averaged second cost function as an average of a plurality of second cost functions determined over several blocks of the particular size;

continually comparing the averaged second cost function with a product of the second cost function and a threshold value, and when the averaged second cost function is less then the product of the second cost function and the threshold value, continually determining the subsequent estimate of the timing skew of each ADC, except the reference ADC, is adjusted to determine the subsequent estimate of the timing skew of each ADC, except the reference ADC, as the sum of an immediately previous estimate of the timing skew of each ADC, except the reference ADC, and a product of a function of the gradient, the step size, and −1.

6. The method according to claim 1, wherein when signals input into the plurality of interleaved ADCs are known to be in a Nyquist band range between the product of a sampling frequency of the interleaved ADC and ½ and the product of the sampling frequency of the interleaved ADC and 3/2, continually determining the subsequent estimate of the timing skew of each ADC, except the reference ADC, is adjusted to determine the subsequent estimate of the timing skew of each ADC, except the reference ADC, as the sum of an immediately previous estimate of the timing skew of each ADC, except the reference ADC, and a product of a function of the gradient, the step size, and −1.

7. The method according to claim 1, wherein determining the converged estimate of the timing skew of each of the plurality of ADCs includes determining the converged estimate without local minima when signals input into the plurality of interleaved analog-to-digital converter circuits meet the regularity condition.

8. A system for estimating timing skew, comprising:
a plurality of interleaved analog-to-digital converter circuits (ADCs), including a reference ADC;
a timing mismatch estimation unit; and
a correction unit; wherein
the timing mismatch estimation unit performs, on the output of the plurality of interleaved analog-to-digital converter circuits ADCs, a gradient loop from a block of samples of a particular size, the gradient loop including:
empirically determining a cross-correlation of the digital output between adjacent ADCs, including determining a cross-correlation between a last among the plurality of ADCs and a first of the plurality of ADCs,
determining a cost function for each of the plurality of ADCs, except the reference ADC, as a square of a difference between adjacent cross-correlations, and
determining a gradient for each of the plurality of ADCs, except the reference ADC, that is proportional to the derivative of the corresponding cost function of each of the plurality of ADCs, except the reference ADC;
the timing mismatch estimation unit determines an initial estimate of a timing skew of each of the plurality of ADCs, except the reference ADC, as the product of a function of the gradient of each of the plurality of ADCs, except the reference ADC, and a step size;
the correction unit corrects the output of each of the plurality of ADCs, except the reference ADC, based on the initial estimate of the timing skew of each of the plurality of ADCs, except the reference ADC; and the timing mismatch estimation unit determines a converged estimate of the timing skew of each of the plurality of ADCs, except the reference ADC, by:
continually performing on the output of the plurality of interleaved ADCs, including the reference ADC, the gradient loop on additional blocks of samples of the particular size,
continually determining a subsequent estimate of the timing skew of each ADC, except the reference ADC, as the sum of an immediately previous estimate of the timing skew of each ADC, except the reference ADC, and a product of a function of the gradient of each of the plurality of ADCs, except the reference ADC, and the step size,
the correction unit continually correcting the output of each of the plurality of ADCs, except the reference ADC, based on the continually determined subsequent estimate of the timing skew of each of the plurality of ADCs, except the reference ADC.

9. The system according to claim 8, wherein the step size decreases as the estimate of the timing skew decreases.

10. The system according to claim 8, wherein the step size can be either a single parameter or a set of parameters.

11. The system according to claim 8, wherein the function of the gradient is one of the gradient itself and a sign function of the gradient.

12. The system according to claim 8, wherein the timing mismatch estimation unit determining the converged estimate of the timing skew of each of the plurality of ADCs, except the reference ADC, additionally includes:
continually setting a second cost function as the sum of the absolute value of the gradient function for each of the plurality of ADCs;
continually setting an averaged second cost function as an average of a plurality of second cost functions determined over several blocks of the particular size;
continually comparing the averaged second cost function with a product of the second cost function and a threshold value, and when the averaged second cost function is less then the product of the second cost function and the threshold value, the timing mismatch estimation unit continually determining the subsequent estimate of the timing skew of each ADC, except the reference ADC, is adjusted to determine the subsequent estimate of the timing skew of each ADC, except the reference ADC, as the sum of an immediately previous estimate of the timing skew of each ADC, except the reference ADC, and a product of a function of the gradient, a predetermined step size, and −1.

13. The system according to claim 8, wherein when signals input into the plurality of interleaved ADCs are known to be in a Nyquist band range between the product of a sampling frequency of the interleaved ADC and ½ and the product of the sampling frequency of the interleaved ADC and 3/2, the timing mismatch estimation unit continually determining the subsequent estimate of the timing skew of each ADC, except the reference ADC, is adjusted to determine the subsequent estimate of the timing skew of each ADC, except the reference ADC, as the sum of an immediately previous estimate of the timing skew of each ADC, except the reference ADC, and a product of a function of the gradient, a predetermined step size, and −1.

14. The system according to claim 8, wherein
the timing mismatch estimation unit determining the converged estimate of the timing skew of each of the plurality of ADCs includes determining the converged estimate without local minima when signals input into the plurality of interleaved analog-to-digital converter circuits meet the regularity condition.

15. Timing skew estimation circuitry having components configured to preserve operations, the operations implementing a method for estimating timing skew, comprising:
performing, on the output of a plurality of interleaved analog-to-digital converter circuits (ADCs) including a reference ADC, a gradient loop from a block of samples of a particular size, the gradient loop including:
empirically determining a cross-correlation of the digital output between adjacent ADCs, including determining a cross-correlation between a last among the plurality of ADCs and a first of the plurality of ADCs,
determining a cost function for each of the plurality of ADCs, except a reference ADC, as a square of a difference between adjacent cross-correlations, and
determining a gradient for each of the plurality of ADCs, except the reference ADC, that is proportional to the derivative of the corresponding cost function of each of the plurality of ADCs, except the reference ADC;
determining an initial estimate of a timing skew of each of the plurality of ADCs, except the reference ADC, as the product of a function of the gradient of each of the plurality of ADCs, except the reference ADC, and a step size;
correcting the output of each of the plurality of ADCs, except the reference ADC, based on the initial estimate of the timing skew of each of the plurality of ADCs, except the reference ADC; and
determining a converged estimate of the timing skew of each of the plurality of ADCs, except the reference ADC, by:
continually performing on the output of the plurality of interleaved ADCs, including the reference ADC, the gradient loop on additional blocks of samples of the particular size,
continually determining a subsequent estimate of the timing skew of each ADC, except the reference ADC, as the sum of an immediately previous estimate of the timing skew of each ADC, except the reference ADC, and a product of a function of the gradient of each of the plurality of ADCs, except the reference ADC, and the step size, and
continually correcting the output of each of the plurality of ADCs, except the reference ADC, based on the continually determined subsequent estimate of the timing skew of each of the plurality of ADCs, except the reference ADC.

16. The timing skew estimation circuitry according to claim 15, wherein
the step size decreases as the estimate of the timing skew decreases.

17. The timing skew estimation circuitry according to claim 15, wherein
the function of the gradient is one of the gradient itself and a sign function of the gradient.

18. The timing skew estimation circuitry according to claim 15, wherein
determining the converged estimate of the timing skew of each of the plurality of ADCs, except the reference ADC, additionally includes:
continually setting a second cost function as the sum of the absolute value of the gradient function for each of the plurality of ADCs;
continually setting an averaged second cost function as an average of a plurality of second cost functions determined over several blocks of the particular size;
continually comparing the averaged second cost function with a product of the second cost function and a threshold value, and when the averaged second cost function is less then the product of the second cost function and the threshold value, continually determining the subsequent estimate of the timing skew of each ADC, except the reference ADC, is adjusted to determine the subsequent estimate of the timing skew of each ADC, except the reference ADC, as the sum of an immediately previous estimate of the timing skew of each ADC, except the reference ADC, and a product of a function of the gradient, the step size, and −1.

19. The timing skew estimation circuitry according to claim 15, wherein
when signals input into the plurality of interleaved ADCs are known to be in a Nyquist band range between the product of a sampling frequency of the interleaved ADC and ½ and the product of the sampling frequency of the interleaved ADC and 3/2, continually determining the subsequent estimate of the timing skew of each ADC, except the reference ADC, is adjusted to determine the subsequent estimate of the timing skew of each ADC, except the reference ADC, as the sum of an immediately previous estimate of the timing skew of each ADC, except the reference ADC, and a product of a function of the gradient, the step size, and −1.

20. The timing skew estimation circuitry according to claim 15, wherein
determining the converged estimate of the timing skew of each of the plurality of ADCs includes determining the converged estimate without local minima when signals input into the plurality of interleaved analog-to-digital converter circuits meet the regularity condition.

* * * * *